(12) United States Patent
Krishnan

(10) Patent No.: US 7,045,433 B1
(45) Date of Patent: May 16, 2006

(54) TIP ARCHITECTURE WITH SPE FOR BUFFER AND DEEP SOURCE/DRAIN REGIONS

(75) Inventor: Srinath Krishnan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/817,819

(22) Filed: Apr. 6, 2004

(51) Int. Cl.
*H01L 21/336* (2006.01)

(52) U.S. Cl. ............... 438/305; 438/303; 438/304; 438/306

(58) Field of Classification Search ........ 438/303–305, 438/372
See application file for complete search history.

(56) References Cited

U.S. PATENT DOCUMENTS

| 6,225,176 B1 * | 5/2001 | Yu ........................ 438/305 |
| 6,506,650 B1 * | 1/2003 | Yu ........................ 438/301 |
| 6,689,671 B1 * | 2/2004 | Yu et al. ................ 438/486 |
| 6,893,909 B1 * | 5/2005 | Wang et al. ............ 438/166 |

\* cited by examiner

*Primary Examiner*—Dung A. Le

(57) ABSTRACT

A method of manufacturing a semiconductor device includes forming a gate, source/drain extensions, buffer regions, and source/drain regions. The gate is formed over a semiconductor layer, and the source/drain extensions are formed within the semiconductor layer and adjacent the gate. The buffer regions are formed within first amorphous implant regions, and the source/drain regions are formed within second amorphous implant regions. The buffer regions and the source/drain regions are activated using solid-phase epitaxy whereby sidewalls of the activated buffer regions and the activated source/drain regions are substantially vertical.

20 Claims, 3 Drawing Sheets

TIP ARCHITECTURE WITH SPE FOR BUFFER AND DEEP SOURCE/DRAIN REGIONS

FIELD OF THE INVENTION

The present invention relates to the manufacturing of semiconductor devices, and more particularly, to a method of engineering source/drain features having hyper-abrupt profiles.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a transistor. The transistor is one of the basic building blocks of most modern electronic circuits. Importantly, these electronic circuits realize improved performance and lower costs, as the performance of the transistor is increased and as manufacturing costs are reduced.

A typical transistor includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain. Associated with source/drain regions are source/drain extensions that are formed adjacent the source/drain regions and reduce a channel length of the transistor.

Transistors with shallow and ultra-shallow source/drain extensions have become more difficult to manufacture. Forming source/drain extensions with junction depths of less than 30 nm is very difficult using conventional fabrication techniques. Conventional ion implantation and diffusion-doping techniques make transistors susceptible to short-channeling effects. Additionally, conventional ion implantation techniques have difficulty maintaining shallow source and drain extensions because point defects generated in the bulk semiconductor substrate during ion implantation can cause the dopant to more easily diffuse. The presence of excess silicon interstitials in the vicinity of an implanted dopant distribution such as boron causes an effect known as transient enhanced diffusion (TED).

TED is characterized by a gradient in the concentration profile of excess interstitials that causes a large enhancement in dopant diffusion rate in the "downhill" direction of the negative gradient. The effect is short in duration, lasting only several minutes at temperatures as low as 800° C., and only seconds at higher temperatures, until the excess interstitials recombine or are otherwise removed from the vicinity of the dopant. However, during this short period, the effective diffusivity of the dopants can be enhanced by a factor of more than 10,000. As the damage peak is positioned slightly shallower than the dopant peak, the enhanced diffusion tends to shift the dopants deeper into the silicon. As a result, the movement of the dopants due to the damage created by the implant process is a primary factor in determining the final junction depths and profile shapes of the source/drain regions.

Continued miniaturization of semiconductor devices necessitates reliable formation of ultra shallow source/drain extension. Accordingly, there exists a need for semiconductor device and method of manufacture that provides low-resistance, shallow source/drain extensions with reduced short-channeling effects and reduced transient enhanced diffusion.

SUMMARY OF THE INVENTION

This and other needs are met by embodiments of the present invention which provide a method of manufacturing a semiconductor device. The method includes forming a gate, source/drain extensions, buffer regions, and source/drain regions. The gate is formed over a semiconductor layer, and the source/drain extensions are formed within the semiconductor layer and adjacent the gate. The buffer regions are formed within first amorphous implant regions, and the source/drain regions are formed within second amorphous implant regions. The buffer regions and the source/drain regions are activated using solid-phase epitaxy whereby sidewalls of the activated buffer regions and the activated source/drain regions are substantially vertical. The semiconductor layer is part of a silicon-on-insulator structure.

In certain aspects of the inventive concept, the first amorphous implant regions are formed within the semiconductor layer adjacent the source/drain extensions, and the second amorphous implant regions are formed within the semiconductor layer adjacent the buffer regions. First sidewall spacers can be formed adjacent the gate and be used as a mask during the formation of the first amorphous implant regions and the formation of the buffer regions. Second sidewall spacers can be formed adjacent the first sidewall spacers and be used as a mask during the formation of the second amorphous implant regions and the formation of the source/drain regions. Afterwards, the second sidewall spacers can be removed.

In other aspects of the inventive concept, a depth of the first amorphous implant regions is between about 40 and about 60 nm, and a depth of the second amorphous implant regions is between about 70 and about 100 nm. The first and second amorphous implant regions are formed by implanting the semiconductor layer with ions selected from the group consisting of silicon, germanium, and xenon. The activated buffer regions are deeper than the source/drain extensions, and the activated source/drain regions are deeper than the activated buffer regions.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

Figure 1:
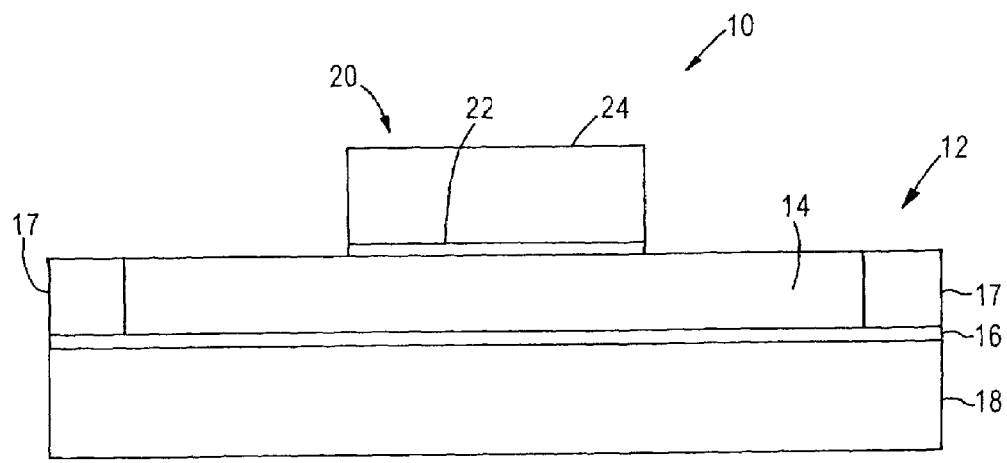
FIGS. 1–5 schematically illustrate sequential phases of a method of manufacturing a semiconductor device according to one embodiment of the present invention.

The present invention involves forming a semiconductor device that includes buffer regions and source/drain regions having hyper-abrupt profiles using a low-temperature solid-phase epitaxy process to reduce transient enhanced diffusion and short-channeling effects. With reference to FIG. 1, a semiconductor device 10 includes a gate 20 formed over a wafer 12. The wafer 12 can be formed from any material suitable for integrated circuit manufacture. For example, the wafer 12 can be formed from single-crystal silicon having a <100> crystallographic orientation, which has been slightly doped with n-type or p-type impurities. In one aspect of the semiconductor device 10, the wafer 12 uses a silicon-on-insulator (SOI) structure. For example, the SOI wafer 12 includes a substrate 18, an active (or semiconductor) layer 14, and an insulating layer 16 disposed therebetween. The semiconductor layer 14 may be slightly doped with n-type or p-type impurities. Separate semiconductor devices 10 can be separated on the wafer 12 using isolation structures 17, such as a field oxide or a shallow isolation trench.

The gate 20 includes a gate dielectric 22 and a gate electrode 24, which can be formed using conventional techniques. For example, the formation of the gate dielectric 22 can involve depositing/growing a layer of dielectric material, such as $SiO_2$, $Si_3N_4$, or $Ta_2O_5$, on the semiconductor layer 14, and the formation of a gate electrode 24 can involve depositing a blanket layer of undoped polysilicon, for example by low pressure chemical vapor deposition (LPCVD) at temperatures from about 600 to 800° C., on the top surface of gate dielectric 22. The polysilicon layer can then be doped with ions, such as nitrogen, boron, and arsenic.

The layers 22, 24 over the semiconductor layer 14 are then etched to form the gate 20. The etching of the gate 20 typically involves forming a photoresist on the polysilicon layer 24, and then the photoresist is selectively irradiated using a photolithographic system, such as a step and repeat optical projection system, in which ultraviolet light from a mercury-vapor lamp is projected through a first reticle and a focusing lens to obtain a first image pattern. The photoresist is then developed, and the irradiated portions of the photoresist are removed to provide openings in the photoresist. The openings expose portions of the polysilicon layer 24, which will thereby define the gate 20. An etch, typically anisotropic, such as reactive ion etching, is then applied to remove the exposed portions of the polysilicon layer 24 and the underlying portions of the gate dielectric 22.

Figure 2:
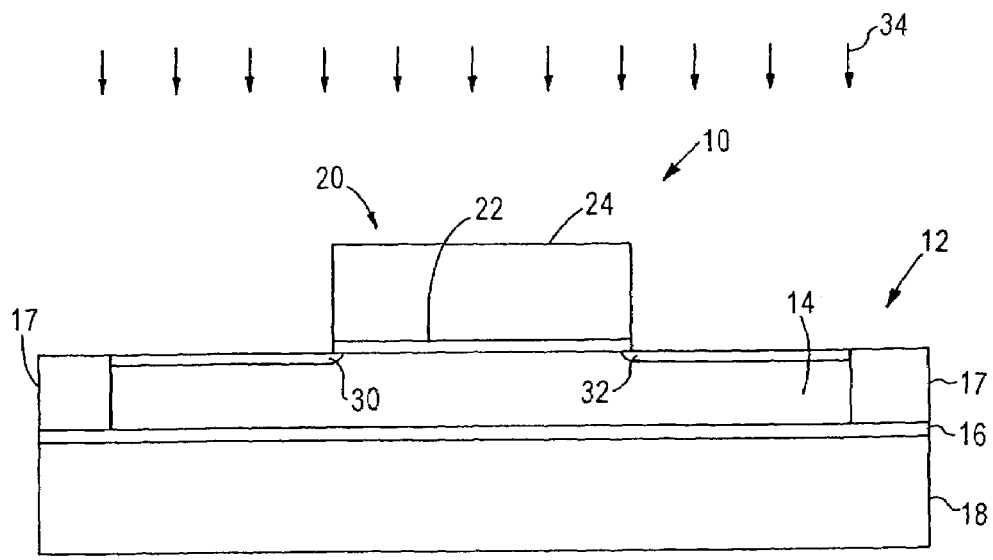

With reference to FIG. 2, after the photoresist is stripped, lightly doped (LDD) source/drain extensions 30, 32 are formed by doping, as represented by arrows 34. The doping may be with an n-type dopant, such as arsenic or phosphorus, if an NMOSFET is desired, or with a p-type dopant, such as boron or antimony, if a PMOSFET is desired. Illustrative examples of implant energies and dosages for doping respectively range from about 2 to 80 keV and from about $1 \times 10^{12}$ to $5 \times 10^{15}$ dopants/cm². The source/drain extensions 30, 32 are formed within the semiconductor layer 14 immediately adjacent to sidewalls of the gate 20 and are self-aligned with the gate 20. After doping, the source/drain extensions 30, 32 are activated using a thermal process, such as spike rapid thermal annealing, which involves increasing the ramping rate of the rapid thermal anneal.

Figure 3:
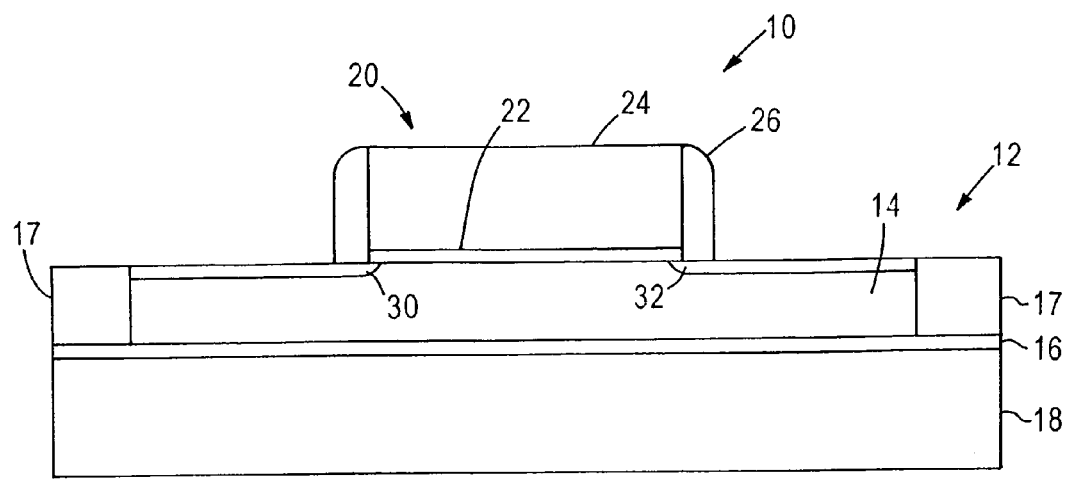

With reference to FIG. 3, first sidewall spacers 26 are formed adjacent or abutting the gate 20. The spacers 26 are formed using conventional techniques, such as deposition using a plasma enhanced chemical vapor deposition (PECVD) process followed by an etch. Exemplary materials for use as the first sidewall spacers 26 include, but are not limited to silicon oxide and silicon nitride. Other example materials include plasma-enhanced oxide (PEOX) or tetra-ethoxysilane (TEOS) oxide.

Figure 4:
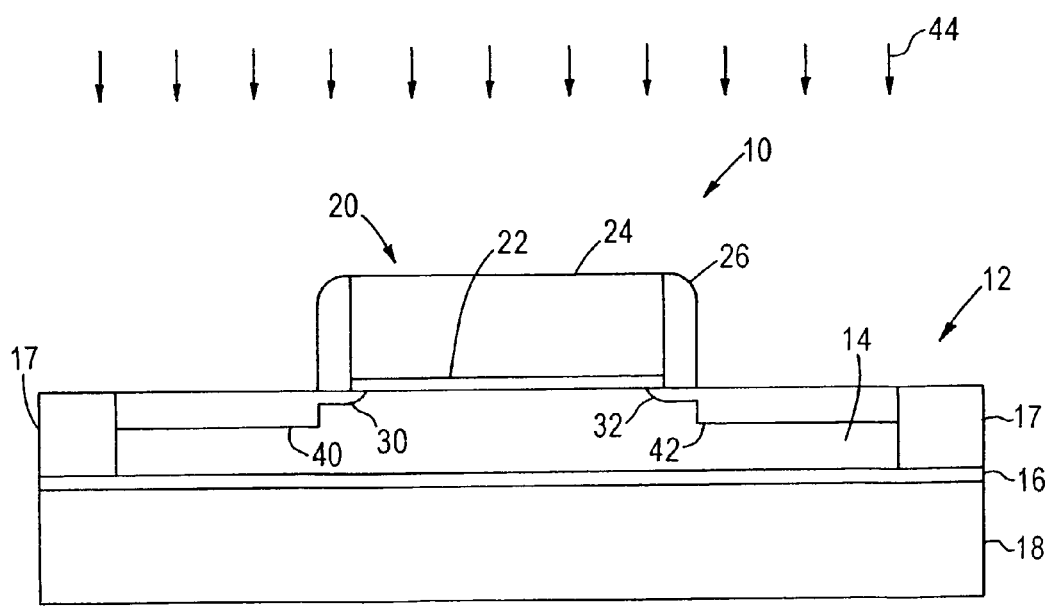

With reference to FIG. 4, after the first spacers 26 are formed, the semiconductor layer 14 is subjected to a pre-amorphization implant (PAI) to form an amorphous implant region. In one aspect of the semiconductor device 10, the PAI forms the amorphous region to a depth of between about 40 nm and about 60 nm from the top surface of the semiconductor layer 14. The PAI technique involves charging semiconductor ions, such as silicon, germanium, or xenon ions, and implanting the ions into the semiconductor layer 14, and the ions change the single-crystal silicon into amorphous silicon. In one aspect of the semiconductor device 10, the PAI is performed using silicon ions charged to about 45 keV to implant a dose from about $1 \times 10^{15}$ to about $1 \times 10^{16}$ dopants/cm².

After the amorphous region is formed using PAI, buffer regions 40, 42 are formed by a second ion doping, as represented by arrows 44. The buffer regions 40, 42 are formed within the semiconductor layer 14 and extend past the source/drain extensions 30, 32 immediately adjacent to the first sidewall spacers 26. The first sidewall spacers 26 act as masks, which protect portions of the source/drain extensions 30, 32 from being heavily doped. The implant 44 is p-type or n-type dopants, and illustrative examples of implant energies and dosages for doping respectively range from about 0.5 keV to 60 keV and from about $1 \times 10^{15}$ to about $1 \times 10^{16}$ dopants/cm².

Figure 5:
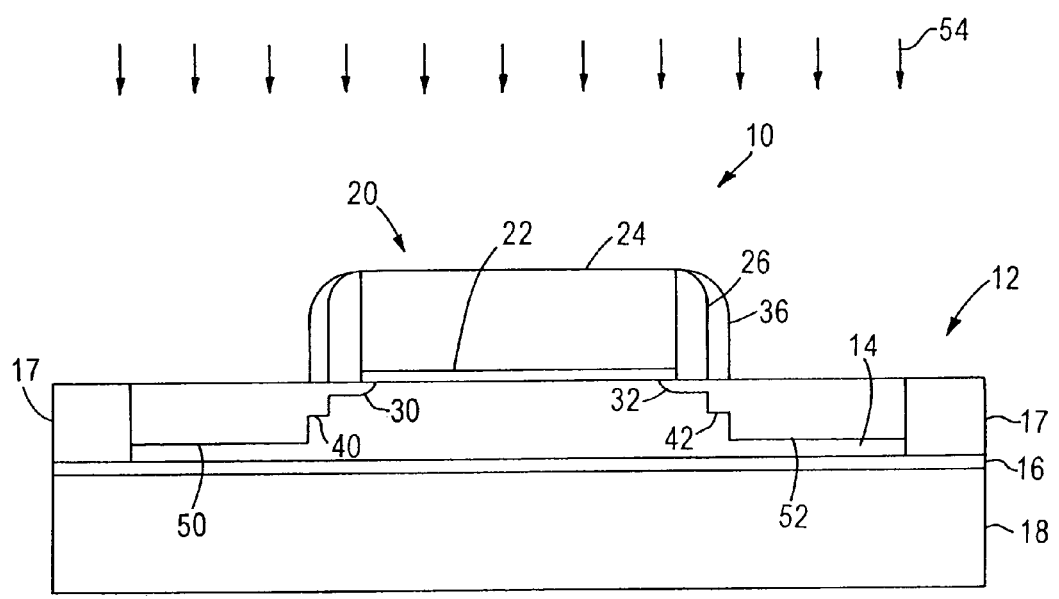

With reference to FIG. 5, second sidewall spacers 36 are formed adjacent and abutting the first sidewall spacers 26. The second sidewall spacers 36 can be formed using a similar process and similar materials to the process and materials used to form the first sidewall spacers 26. After second sidewall spacers 36 are formed, the semiconductor layer 14 is subjected to a second pre-amorphization implant (PAI) similar to the first PAI. The second PAI forms a deeper amorphous region in the semiconductor layer 14 in the regions not covered by the gate 20 or the first and second sidewall spacers 26, 36. In one aspect of the semiconductor device 10, the second PAI forms the amorphous region to a depth of between about 70 nm and about 100 nm from the top surface of the semiconductor layer 14, and the second PAI is performed using silicon ions charged to about 60 keV to implant a dose from about $1 \times 10^{15}$ to about $1 \times 10^{16}$ dopants/cm². The second sidewall spacers 36 can remain or, alternatively, be removed, for example, using an etch that is highly selective to a material used to formed the second sidewall spacers 36.

After the amorphous region is formed using the second PAI, source/drain regions 50, 52 are formed by a third ion doping, as represented by arrows 54. The source/drain regions 50, 52 are formed within the semiconductor layer 14 and extend past the source/drain extensions 30, 32 and the buffer regions 40, 42 and are immediately adjacent to the second sidewall spacers 36. The second sidewall spacers 36 act as masks, which protect portions of the source/drain extensions 30, 32 and the buffer regions 40, 42 from being doped during the third ion doping. The implant 54 is p-type or n-type dopants, and illustrative examples of implant energies and dosages for doping respectively range from about 0.5 keV to 60 keV and from about $1 \times 10^{15}$ to about $1 \times 10^{16}$ dopants/cm$^2$.

After the ions 44, 54 are respectively implanted into the amorphous regions the semiconductor device 10 undergoes a low-temperature anneal, known as solid-phase epitaxy (SPE). The SPE occurs at temperatures below 700° C., and typically within a range from about 550° C. to about 650° C. At these temperatures, substantially all of the ions 44, 54 within the amorphous regions are activated and only an insignificant amount of dopants in the crystalline portion of the semiconductor layer 14 are activated. This results in a hyper-abrupt (extremely steep) active dopant profile, in which the sides of the buffer regions 40, 42 and the source/drain regions 50, 52 are substantially vertical. By using the SPE process to activate the ions in the buffer regions and source/drain regions, hyper-abrupt profiles for the active regions are provided. Furthermore, the low-temperature SPE process reduces transient enhanced diffusion and short-channel effects thereby providing highly controllable junctions.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
    forming a gate over a semiconductor layer;
    forming source/drain extensions within crystalline regions in the semiconductor layer and adjacent the gate;
    forming first amorphous implant regions within the semiconductor layer and adjacent the source/drain extensions;
    forming buffer regions within the first amorphous implant regions by doping the first amorphous implant regions;
    forming second amorphous implant regions within the semiconductor layer and adjacent the buffer regions;
    forming source/drain regions within the second amorphous implant regions by doping the second amorphous implant regions; and
    activating the buffer regions and the source/drain regions.

2. The method according to claim 1, wherein the semiconductor layer is included within a silicon-on-insulator structure.

3. The method according to claim 1, further comprising the step of forming first sidewall spacers adjacent the gate and using the first sidewall spacers as a mask during the forming of the first amorphous implant regions and the forming of the buffer regions.

4. The method according to claim 3, further comprising the step of forming second sidewall spacers adjacent the first sidewall spacers and using the second sidewall spacers as a mask during the forming of the second amorphous implant regions and the forming of the source/drain regions.

5. The method according to claim 4, further comprising the step of removing the second sidewall spacers.

6. The method according to claim 1, wherein a depth of the first amorphous implant regions is between about 40 and about 60 nm.

7. The method according to claim 6, wherein a depth of the second amorphous implant regions is between about 70 and about 100 nm.

8. The method according to claim 1, wherein the first amorphous implant regions are formed by implanting the semiconductor layer with ions selected from the group consisting of silicon, germanium, and xenon.

9. The method according to claim 1, wherein the second amorphous implant regions are formed by implanting the semiconductor layer with ions selected from the group consisting of silicon, germanium, and xenon.

10. The method according to claim 1, wherein the activated buffer regions are deeper than the source/drain extensions.

11. The method according to claim 10, wherein the activated source/drain regions are deeper than the activated buffer regions.

12. The method according to claim 1, wherein the buffer regions and the source/drain regions are activated using solid-phase epitaxy.

13. The method according to claim 12, wherein a temperature used during the solid-phase epitaxy does not exceed 700° C.

14. The method according to claim 13, wherein a temperature used during the solid-phase epitaxy does not exceed between about 550 and about 650° C.

15. The method according to claim 12, wherein sidewalls of the activated buffer regions and the activated source/drain regions are substantially vertical.

16. A method of manufacturing a semiconductor device, comprising the steps of:
    forming a gate over a semiconductor layer, forming source/drain extensions within crystalline regions in the semiconductor layer and adjacent the gate;
    forming first amorphous implant regions within the semiconductor layer and adjacent the source/drain extensions by implanting the semiconductor layer with ions selected from the group consisting of silicon, germanium, and xenon;
    forming buffer regions within the first amorphous implant regions by doping the first amorphous implant regions;
    forming second amorphous implant regions within the semiconductor layer and adjacent the buffer regions by implanting the semiconductor layer with ions selected from the group consisting of silicon, germanium, and xenon;
    forming source/drain regions within the second, amorphous implant regions by doping the second amorphous implant regions; and
    activating the buffer regions and the source/drain regions using solid-phase epitaxy, wherein sidewalls of the activated buffer regions and the activated source/drain regions are substantially vertical.

17. The method according to claim 1, wherein the step of forming source/drain extensions includes: doping the crystalline regions of the semiconductor layer immediately adjacent to sidewalls of the gate, and activating the source/drain extensions by a thermal process prior to forming the first amorphous implant regions.

18. The method according to claim 17, wherein the thermal process comprises spike rapid thermal annealing.

19. The method according to claim 16, wherein the step of forming source/drain extensions includes: doping the crystalline regions of the semiconductor layer immediately adjacent to sidewalls of the gate, and activating the source/drain extensions by a thermal process prior to forming the first amorphous implant regions.

20. The method according to claim 19, wherein the thermal process comprises spike rapid thermal annealing.

* * * * *